US006017672A

United States Patent [19]

Arai et al.

[11] Patent Number: 6,017,672

[45] Date of Patent: Jan. 25, 2000

[54] HEAT-SENSITIVE RECORDING MATERIAL

[75] Inventors: Yoshimitsu Arai; Masatoshi Yumoto; Kimiatsu Nomura, all of Shizuoka-ken, Japan

[73] Assignee: Fuji Photo Film Co., Ltd., Kanagawa, Japan

[21] Appl. No.: 09/145,345

[22] Filed: Sep. 1, 1998

[30] Foreign Application Priority Data

Sep. 2, 1997 [JP] Japan .................................... 9-237233

[51] Int. Cl.$^7$ ...................................................... G03F 7/016

[52] U.S. Cl. .......................... 430/138; 430/151; 430/156; 430/157; 430/171; 430/182

[58] Field of Search .................................... 430/151, 155, 430/156, 157, 160, 161, 171, 138, 182, 183, 185

[56] References Cited

U.S. PATENT DOCUMENTS

| | | | |
|---|---|---|---|
| 3,944,423 | 3/1976 | Frommeld et al. | 430/183 |
| 4,400,458 | 8/1983 | Walkow et al. | 430/157 |
| 4,956,251 | 9/1990 | Washizu et al. | 430/138 |
| 4,965,166 | 10/1990 | Hosoi et al. | 430/156 |
| 4,980,260 | 12/1990 | Shinozaki et al. | 430/138 |
| 5,935,756 | 8/1999 | Kaifu et al. | 430/138 |

*Primary Examiner*—John S. Chu
*Attorney, Agent, or Firm*—Sughrue, Mion, Zinn, Macpeak & Seas, PLLC

[57] ABSTRACT

A heat-sensitive recording material having formed on a support a heat-sensitive recording layer containing a diazonium salt and a coupling component, wherein the diazonium salt is a compound represented by the following formula (1):

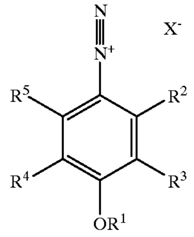

wherein $R^1$ represents an alkyl group or an aryl group; $R^2$, $R^3$, $R^4$ and $R^5$ each independently represents a hydrogen atom or an alkyl group, at least one of $R^2$, $R^3$, $R^4$, and $R^5$ represents an alkyl group, and $R^2$ and $R^3$, or $R^4$ and $R^5$, or $R^1$ and $R^3$, or $R^1$ and $R^4$, may combine with each other to form a ring; and $X^-$ represents an anion.

20 Claims, No Drawings

HEAT-SENSITIVE RECORDING MATERIAL

BACKGROUND OF THE INVENTION

1. Field of the Invention

The present invention relates to a heat-sensitive material using a diazonium salt and a coupling component as color developing components and, particularly, to a heat-sensitive recording material which is stable in light having longer wavelengths from about 350 nm of a light source typified by a fluorescent lamp, etc., and shows good storability before use and good density of color formation upon heating.

2. Description of the Related Art

A diazonium salt is a compound having a very high chemical activity, reacts with a compound called a "coupler", such as phenol derivatives, compounds containing an active methylene group, and the like, to easily form an azo dye. Also, such compounds possess photosensitivity and are decomposed by the irradiation of light, thereby losing their chemical activity. For these reasons, the diazonium salt has been utilized for a long time as an optical recording material typified by diazo copying (see *Fundamentals of Photographic Engineering, Edition of Non-Silver Salt Photography*, edited by Japan Photographic Association, published by Corona Co., Ltd., pp.89–117 and pp. 182–201(1982)).

Furthermore, the diazonium salt is recently applied to a recording material requiring image fixing by utilizing the property of loosing its activity by being decomposed by light. As a typical example, the so-called photo-fixing type heat-sensitive recording material wherein after forming images by heating a recording material provided with a recording layer containing a diazonium salt and a coupling component according to an image signal to cause a reaction of them, the images are fixed by the irradiation of light is proposed (see, Kohji Sato, et al., *Journal of Image Electronic Society*, Vol. 11, No. 4, pp.290–296(1982), etc.).

However, these recording materials using the diazonium salt as the color developing component have the drawback that the shelf-life as the recording material is short because the chemical activity of the diazonium salt is very high. This means that the diazonium salt is gradually decomposed even in the dark, thereby losing reactivity.

As the means for improving the instability of the diazonium salt described above, various methods are proposed and as one of the most effective means, there is a method of encapsulating the diazonium salt in microcapsules. With this method, the diazonium salt is isolated from materials which accelerate the decomposition thereof, such as water and bases. The decomposition of the diazonium salt is remarkably restrained and the shelf-life of the recording material using the microcapsules is greatly improved (see, Toshimasa Usami, et al., *Journal of Electrophotographic Association*, Vol. 26, No. 2, pp.115–125(1987)).

By microencapsulating the diazonium salt as described above, the stability as the heat-sensitive recording material can be greatly improved.

However, when the diazonium salt itself is chemically unstable, even when the diazonium salt is microencapsulated, there is a limit to the improvement in stability of the heat-sensitive recording material. To improve the stability of a heat-sensitive material, it is also important to improve the stability of the diazonium salt itself. In the conventional heat-sensitive recording material using a diazonium salt, after thermally printing, so-called fixing is carried out, that is, by irradiating the recording material thus printed with a light having the absorption wavelength of the diazonium salt, whereby the diazonium salt is photodecomposed to lose the reactivity with the coupling component. Accordingly, when the heat-sensitive recording material is allowed to stand for a long period of time in the light, the photodecomposition of the diazonium salt proceeds. This results in the problem that the density of color formation after storing is liable to fall and the like. In particular, in the case of preparing a multicolor heat-sensitive recording material by laminating plural heat-sensitive recording layers each containing a diazonium salt showing a different developed color hue from each other, there is a problem that when photo-fixing the diazonium salt in the upper layer, the uncolored diazonium salts existing in the lower layers are photodecomposed.

SUMMARY OF THE INVENTION

Accordingly, an object of the present invention is to provide a heat-sensitive recording material, which is stable in light having longer wavelengths from about 350 nm, gives a sufficiently high density of color formation of color-developed images, and has a good stability before use, by using a diazonium salt stable in light of longer wavelengths than about 350 nm of a light source typified by a fluorescent lamp, etc.

As the result of investigations into the photodecomposing property of a diazonium salt, the inventors have discovered that the diazonium salt described below is stable in light of longer wavelengths than about 350 nm, gives a sufficiently high density of color formation of the color-developed images, and has excellent storability before use, and have accomplished the present invention.

That is, according to the present invention, there is provided a heat-sensitive recording material comprising a support having formed on it a heat-sensitive recording layer containing a diazonium salt and a coupling component, wherein the diazonium salt is a compound represented by the following formula (1):

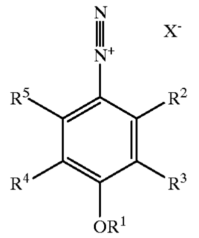

wherein $R^1$ represents an alkyl group or an aryl group; $R^2$, $R^3$, $R^4$, and $R^5$ each independently represents a hydrogen atom or an alkyl group, at least one of $R^2$, $R^3$, $R^4$, and $R^5$ represents an alkyl group, and $R^2$ and $R^3$, or $R^4$ and $R^5$, or $R^1$ and $R^3$, or $R^1$ and $R^4$, may combine with each other to form a ring; and $X^-$ represents an anion.

In the diazonium salts shown by the formula (1) described above, the compound represented by the following formula (2) is particularly preferable:

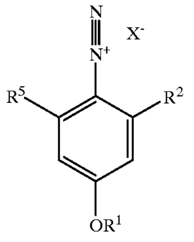

wherein $R^1$ represents an alkyl group or an aryl group; $R^2$ and $R^5$ each independently represents a hydrogen atom or an alkyl group, and at least one of $R^2$ and $R^5$ represents an alkyl group; and $X^-$ represents an anion.

In the present invention, the coupling component is preferably a compound represented by the following formula (3).

$$E^1—CH_2—E^2$$

wherein $E^1$ and $E^2$ each independently represents an electron withdrawing group.

Furthermore, it is preferable that the diazonium salt described above is encapsulated in microcapsules.

The diazonium salt of the present invention represented by the formula (1) or (2) described above has the maximum absorption wavelength on the wavelength side shorter than 350 nm. Thus, the diazonium salt is not substantially fixed by the fixing light of longer wavelengths than 350 nm, which is usually used frequently and also has excellent handling properties in lighted rooms.

Therefore, according to the present invention, a heat-sensitive recording material is provided which gives a very high density of color formation of the color-developed images, can obtain fast images, and has excellent pre-use storage stability with respect to heat and light.

DETAILED DESCRIPTION OF THE INVENTION

The present invention will now be described in detail.

The diazonium salt used in the present invention is represented by the formula (1) or (2) described above and in these formulae, $R^1$ represents an alkyl group or an aryl group.

The alkyl group may be unsubstituted or has a substituent and as the substituent, for example, a halogen atom, an aryl group, an alkenyl group, an alkoxy group, an aryloxy group, an alkoxycarbonyl group, an acyloxy group, an acylamino group, a carbamoyl group, a cyano group, an alkylsulfenyl group, an arylsulfenyl group, an alkylsulfinyl group, an arylsulfinyl group, an alkylsulfonyl group, an arylsulfonyl group, a sulfonamido group, a sulfamoyl group, a carboxy group, a sulfonic acid group, an acyl group, and a heterocyclic group are preferable. In these substituents, a halogen atom, an aryl group, an alkenyl group, an alkoxy group, an aryloxy group, an alkoxycarbonyl group, an acylamino group, a carbamoyl group, and a cyano group are particularly preferable.

Also, as the alkyl group, an alkyl group having from 1 to 30 carbon atoms is preferable and examples of the alkyl group include methyl, ethyl, propyl, butyl, hexyl, 2-ethylhexyl, octyl, decyl, dodecyl, benzyl, allyl, 2-chloroethyl, 2-methoxyethyl, 2-phenoxyethyl, 2-(4-methoxyphenoxy)ethyl, 2-cyanoethyl, ethoxycarbonylmethyl, 2-ethoxycarbonylethyl, and N,N-dibutylcarbamoylmethyl.

The aryl group may be unsubstituted or may have a substituent like, for example, a halogen atom, an aryl group, an alkenyl group, an alkoxy group, an aryloxy group, an alkoxycarbonyl group, an acyloxy group, an acylamino group, a carbamoyl group, a cyano group, an alkylsulfenyl group, an arylsulfenyl group, an alkylsulfinyl group, an arylsulfinyl group, an alkylsulfonyl group, an arylsulfonyl group, a sulfonamido group, a sulfamoyl group, a carboxy group, a sulfonic acid group, an acyl group, and a heterocyclic group are preferable. In these substituents, a halogen atom, an aryl group, an alkoxy group, an alkoxycarbonyl group, an acylamino group, and a carbamoyl group, are particularly preferable.

Also, as the aryl group, an aryl group having from 6 to 30 carbon atoms is preferable and examples thereof include phenyl, 4-methoxyphenyl, and 4-chlorophenyl.

In the above-described formulae (1) and (2), $R^2$, $R^3$, $R^4$, and $R^5$ each independently represents a hydrogen atom or an alkyl group and at least one of $R^2$, $R^3$, $R^4$, and $R^5$ represents an alkyl group. In the formula (1), it is preferable from the standpoint of thermal stability of the diazonium salt that $R^3$ and $R^4$ represent a hydrogen atom and that at least one of $R^2$ and $R^5$ represents an alkyl group.

The alkyl group may be unsubstituted or may have a substituent like, for example, a halogen atom, an aryl group, an alkenyl group, an alkoxy group, an aryloxy group, an alkoxycarbonyl group, an acyloxy group, an acylamino group, a carbamoyl group, a cyano group, an alkylsulfenyl group, an arylsulfenyl group, an alkylsulfinyl group, an arylsulfinyl group, an alkylsulfonyl group, an arylsulfonyl group, a sulfonamido group, a sulfamoyl group, a carboxy group, a sulfonic acid group, an acyl group, and a heterocyclic group are preferable. In these substituents, an aryl group, an alkenyl group, an alkoxy group, an aryloxy group, an acyloxy group, a cyano group, an alkylsulfonyl group, and arylsulfonyl group are particularly preferable.

Also, as the alkyl group, an alkyl group having from 1 to 30 carbon atoms is preferable and examples of the alkyl group include methyl, ethyl, propyl, butyl, hexyl, 2-ethylhexyl, octyl, decyl, dodecyl, benzyl, allyl, phenylsulfonylmethyl, and cyanomethyl. In these groups, methyl, ethyl, propyl, and allyl are particularly preferable.

In the formula (1), $R^2$ and $R^3$, or $R^4$ and $R^5$, or $R^1$ and $R^3$, or $R^1$ and $R^4$, may combine with each other to form a ring, preferably a 5- or 6-membered ring.

As the anion shown by $X^-$, as an inorganic anion, a hexafluorophosphate ion, a borofluoride ion, a chloride ion, and a sulfate ion are preferable, and a hexafluorophosphate ion is particularly preferable. As an organic anion, a polyfluoroalkylcarboxylate ion, a polyfluoroalkylsulfonate ion, a tetraphenylborate ion, an aromatic carboxylate ion, and an aromatic sulfonate ion are preferable.

Practical examples of the diazonium salt of the present invention shown by the formula (1) or (2) are shown below but the present invention is not limited to them.

1-1
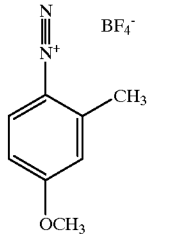
1-2
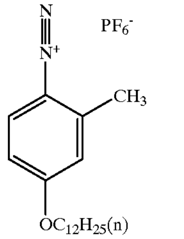
1-3
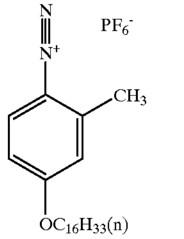
1-4
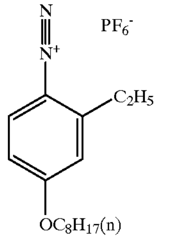
1-5
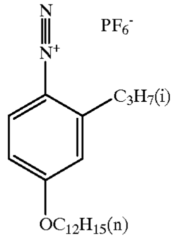
1-6
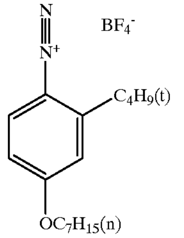
-continued
1-7
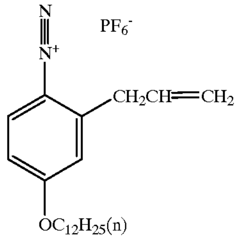
1-8
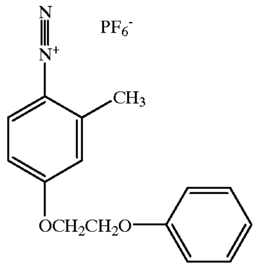
1-9
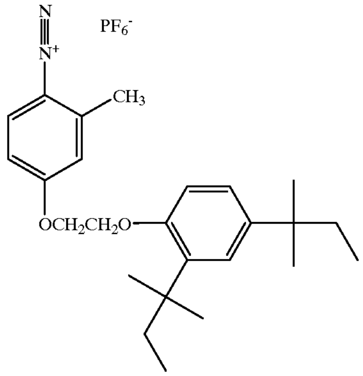
1-10
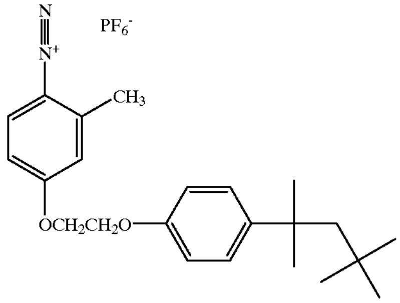
1-11
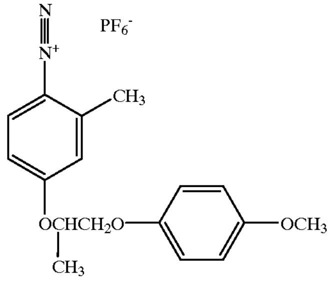

-continued
1-12
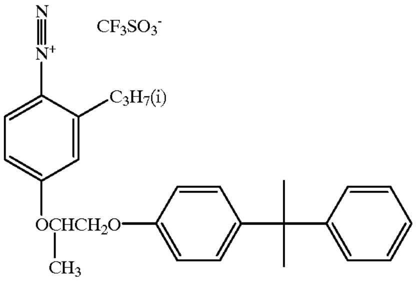
1-13
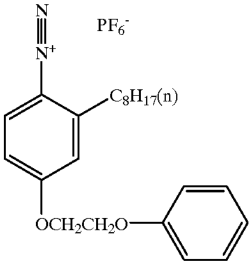
1-14
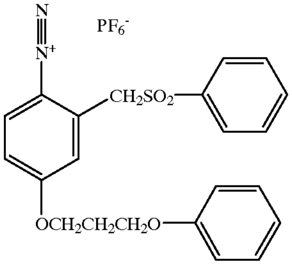
1-15
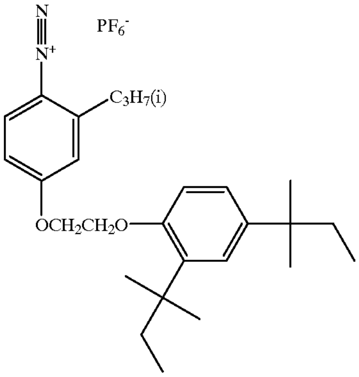
1-16
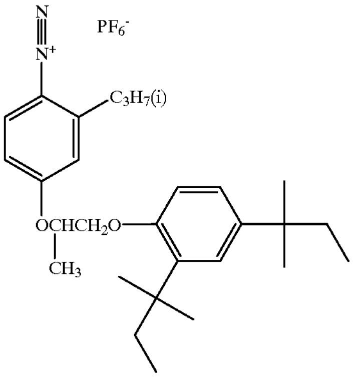
-continued
1-17
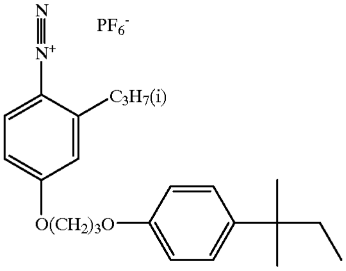
1-18
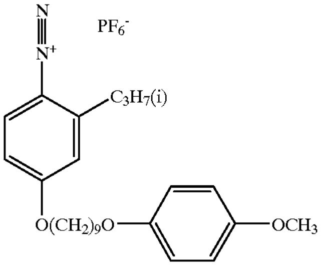
1-19
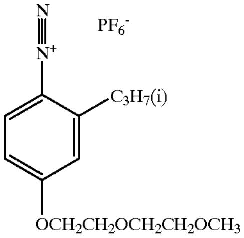
2-1
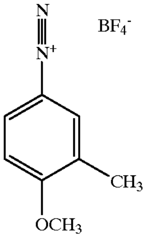
2-2
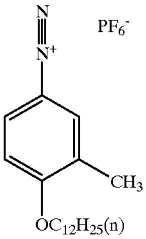
2-3
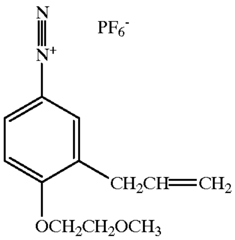

-continued
2-4
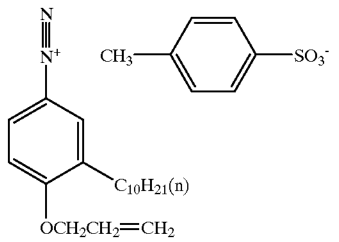
2-5
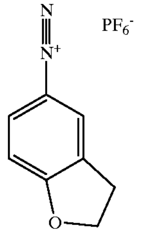
3-1
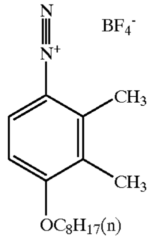
3-2
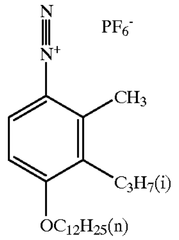
3-3
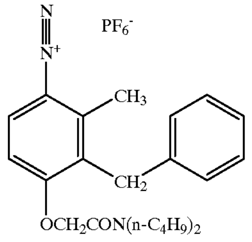
3-4
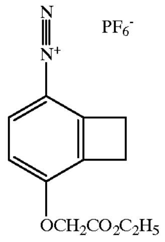
-continued
4-1
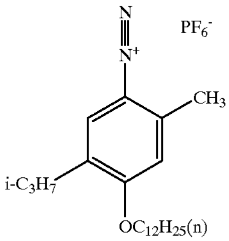
4-2
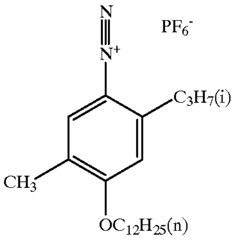
4-3
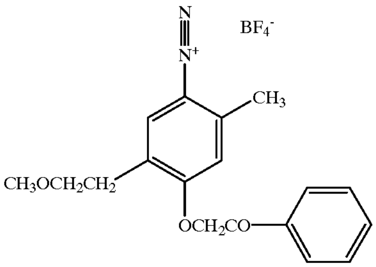
4-4
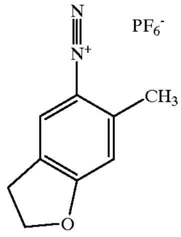
5-1
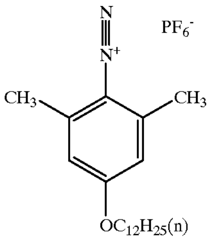

-continued
5-2
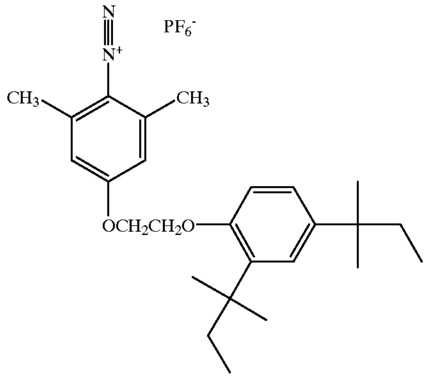
5-3
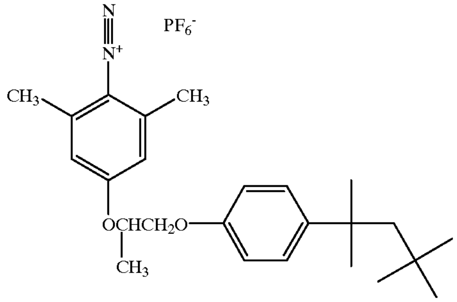
5-4
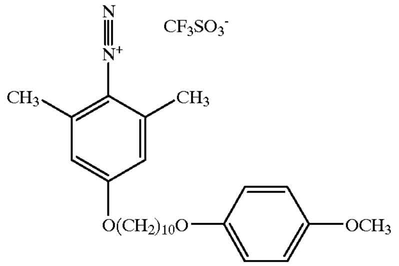
5-5
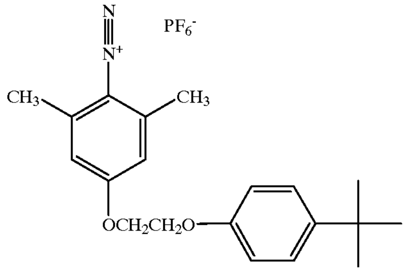
5-6
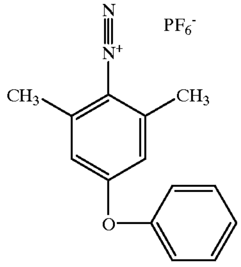
-continued
5-7
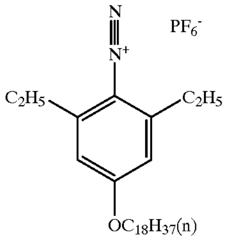
5-8
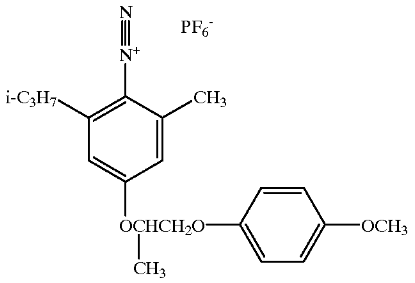
6-1
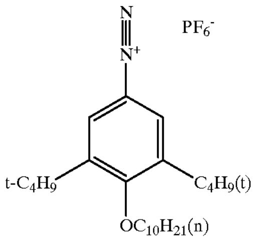
6-2
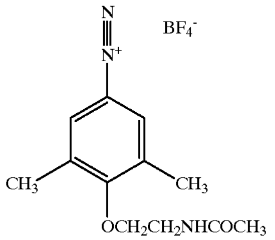
6-3
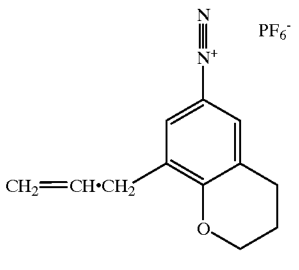
7-1
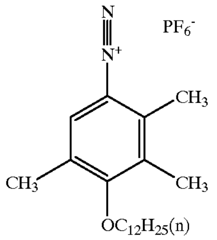

-continued 7-2

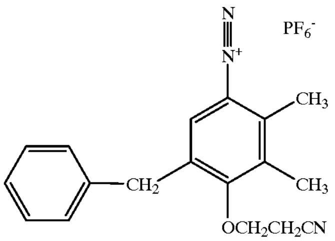

8-1

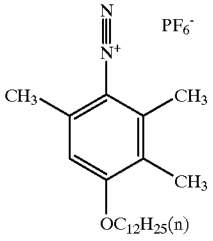

8-2

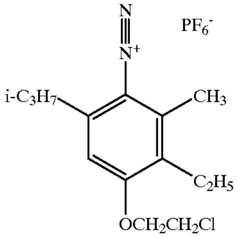

9-1

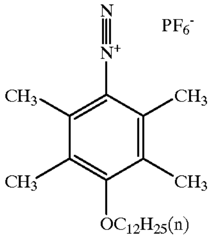

The diazonium salt shown by the formula (1) or (2) can be produced by known methods. That is, the diazonium salt is obtained by diazotizing a corresponding aniline in an acidic solvent using sodium nitrite, nitrosylsulfuric acid, isoamyl nitrite, etc. As an example, the synthesis example of the Compound 1-2 is shown below.

SYNTHESIS EXAMPLE 1

Synthesis of Compound 1-2

A mixture of 25.2 g of 2-methyl-4-dodecyloxyaniline, 21.8 ml of concentrated hydrochloric acid, and 100 ml of methanol was cooled to −5° C. To the mixture was added dropwise a solution of 6.2 g of sodium nitrite dissolved in 30 ml of water and the resultant mixture was stirred for 30 minutes at 0° C. To the reaction mixture were added 19.2 g of potassium hexafluorophosphate and 200 ml of water and the mixture was stirred for 30 minutes at 10° C. The crystals precipitated were collected by filtration, recrystallized from isopropanol, and dried to provide 23.7 g of compound 1-2. The maximum absorption wavelength $\lambda_{max}$ of the ultraviolet absorption spectrum in methanol of this compound was 316 nm, and the molecular extinction coefficient$^{\epsilon}$ thereof was $2.48\times10^4$.

The diazonium salt shown by the formula (1) or (2) may be an oily material or in a crystal state but the crystal state at room temperature is preferable with respect to handling properties.

In the case of making the diazonium salt shown by the formula (1) or (2) an emulsion, the diazonium salt may be dissolved in an appropriate high-boiling solvent (e.g., tricresyl phosphate and dioctyl phthalate) or may be auxiliarily dissolved in a low-boiling solvent (e.g., ethyl acetate). Therefore, it is preferable that the diazonium salt is suitably soluble in these solvents. Specifically, it is preferable that the diazonium salt has a solubility of at least 5% in the above solvents and also it is preferable that the solubility thereof in water is 1% or less.

The diazonium salts shown by the formula (1) or (2) may be used singly or as a combination of two or more kinds.

Also, in the case of using the compound shown by the formula (1) or (2) for a heat-sensitive recording material, it is preferable to use it in the range of from 0.02 to 5 $g/m^2$ in the heat-sensitive recording layer and from the point of the density of color formation, it is particularly preferable to use it in the range of from 0.1 to 4 $g/m^2$.

To stabilize the above-described diazonium salt, the diazonium salt can be stabilized by forming a complex compound thereof using zinc chloride, cadmium chloride, tin chloride, etc. These diazonium salts may be used singly or as a combination of two or more kinds.

As the coupling component used in the present invention, any compound which causes a coupling reaction with the diazonium salt in a basic atmosphere to form a dye can be used. So-called four-equivalent couplers known in the field of silver halide photographic light-sensitive materials can be used as the coupling components in the present invention and they can be selected according to the desired hue.

For example, there are so-called active methylene compounds having a methylene group next to the carbonyl group, phenol derivatives, naphthol derivatives, and the like. Practical examples follow. These compounds are used in the range capable of meeting the object of the present invention.

Specific examples thereof include resorcin, phloroglucin, sodium 2,3-dihydroxynaphthalene-6-sulfonate, sodium 2-hydroxy-3-naphthalenesulfonate, 2-hydroxy-3-naphthalenesulfonanilide, 1-hydroxy-2-(N-morpholinopropyl) naphthoamide, 2-hydroxy-3-(N-morpholinopropyl) naphthalenesulfonamide, 2-hydroxy-3-(N-2-ethylhexyloxypropyl)naphthalenesulfonamide, 2-hydroxy-3-(N-2-ethylhexyl)naphthalenesulfonamide, 5-acetamido-1-naphthol, disodium 1-hydroxy-8-acetamidonaphthelene-3,6-disulfonate, 1-hydroxy-8-acetamidonaphthelene-3,6-disulfonanilide, 1,5-dihydroxynaphthalene, 2,3-dihydroxynaphthalene, 2-hydroxy-3-(N-morpholinopropyl) naphtoamide, 2-hydroxy-3-(N-octyl)naphtoamide, 2-hydroxy-3-naphtoanilide, 5,5-dimethyl-1,3-cyclohexanedione, 1,3-cyclopentadione, 5-(2-n-tetradecyloxyphenyl)-1,3-cyclohexanedione, 5-phenyl-4-methoxycarbonyl-1,3-cyclohexanedione, 5-(2,5-di-n-octyloxyphenyl)-1,3-cyclohexanedione, 1,3-dicyclohexylbarbituric acid, 1,3-di-n-dodecylbarbituric acid, 1-n-octyl-3-n-octadecylbarbituric acid, 1-phenyl-3-(2,5-di-n-octyloxyphenyl)barbituric acid, 1,3-bis(octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamido-5-pyrazolone, 6-hydroxy-4-methyl-3-cyano-1-(2-ethylhexyl)-2-pyridone, 2-[3-[α-(2,4-di-tert-amylphenoxy)butanamido]benzamido]phenol, 2,4-bis-(benzoylacetamino)toluene, 1,3-bis-(pivaloylacetaminomethyl)benzene, benzoylacetonitrile, thenoylacetonitrile, acetoacetanilide, benzoylacetanilide, pivaloylacetanilide, 2-chloro-5-(N-n-butylsulfamoyl)-1-pivaloylacetamidobenzene, 1-(2-ethylhexyloxypropyl)-3-cyano-4-methyl-6-hydroxy-1,2-dihydropyridin-2-one, 1-(dodecyloxypropyl)-3-acetyl-4-methyl-6-hydroxy-1,2-dihydropyridin-2-one, 1-(4-n-octyloxyphenyl)-3-tert-butyl- 5-aminopyrazole, trifluoroacetoacetanilide, 4-hydroxycoumarin, pyrazolo[1,5-a]pyrimidinedione, and 3-ethyl-6-ethoxyuracil.

Details of the couplers are described in Japanese Patent Application Laid-Open (JP-A) Nos. 4-201483, 7-125446, 7-96671, 7-223367, 7-223368, etc.

The coupling components which can be used for the heat-sensitive recording materials of the present invention are most preferably the compounds represented by the formula (3) described above. The coupling component shown by the formula (3) is explained in detail below.

The electron withdrawing groups shown by $E^1$ and $E^2$ in the formula (3) are substituents wherein Hammett's substituent constant $\delta_p$ is positive and they may be the same or different. As the electron withdrawing group, an acyl group such as acetyl, propionyl, pivaloyl, chloroacetyl, trifluoroacetyl, 1-methylcyclopropylcarbonyl, 1-ethylcyclopropylcarbonyl, 1-benzylcyclopropylcarbonyl, benzoyl, 4-methoxybenzoyl, thenoyl, etc.; an oxycarbonyl group such as methoxycarbonyl, ethoxycarbonyl, 2-methoxyethoxycarbonyl, 4-methoxyphenoxycarbonyl, etc.; a carbamoyl group such as carbamoyl, N,N-dimethylcarbamoyl, N,N-diethylcarbamoyl, N-phenylcarbamoyl, N-2,4-bis(pentyloxy)phenylcarbamoyl, N-2,4-bis(octyloxy)phenylcarbamoyl, morpholinocarbonyl, etc.; a cyano group; a sulfonyl group such as methanesulfonyl, benzenesulfonyl, toluenesulfonyl, etc.; a phosphono group such as diethylphosphono, etc.; and a heterocyclic group such as benzoxazol-2-yl, benzothiazol-2-yl, 3,4-dihydroquinazolin-4-on-2-yl, 3,4-dihydroquinazolin-4-sulfon-2-yl, etc., are preferable.

Also, the electron withdrawing groups shown by $E^1$ and $E^2$ may combine with each other to form a ring. A ring formed by $E^1$ and $E^2$ is preferably a 5- or 6-membered carbon ring or a heterocyclic ring.

Specific examples of the coupling component shown by the formula (3) used in the present invention are illustrated below but the present invention is not limited to these compounds.

C-1

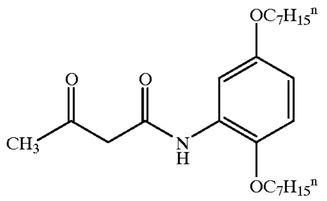

C-2

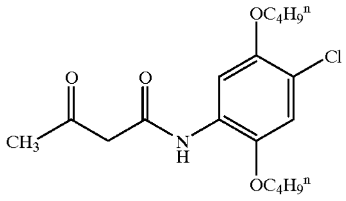

C-3

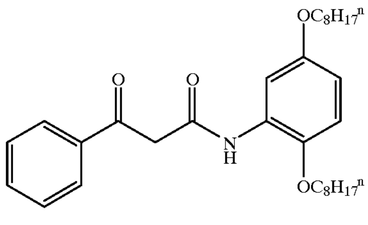

-continued

C-4

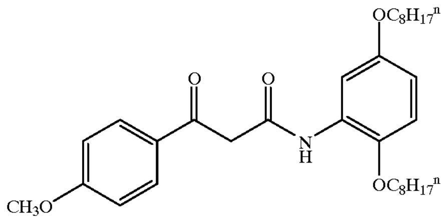

C-5

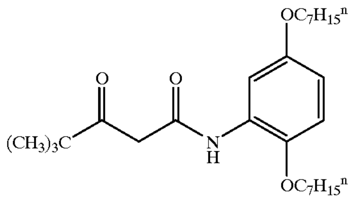

C-6

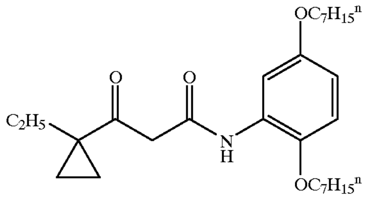

C-7

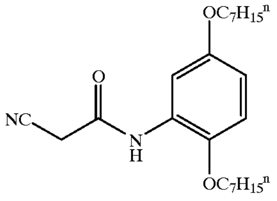

C-8

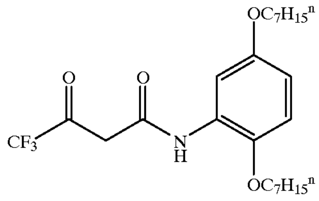

C-9

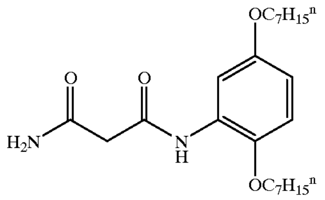

C-10

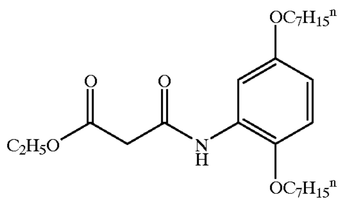

-continued
C-11
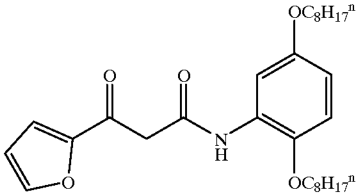
C-12
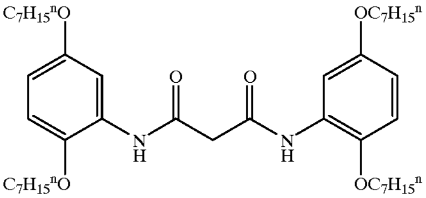
C-13
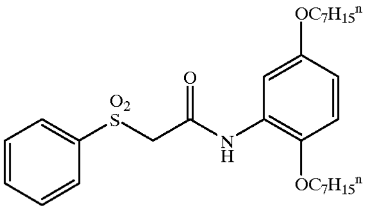
C-14
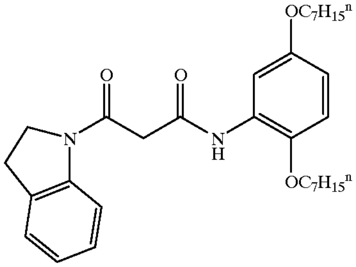
C-15
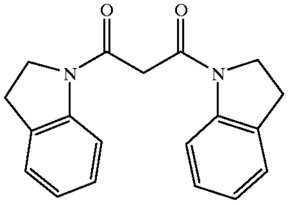
C-16
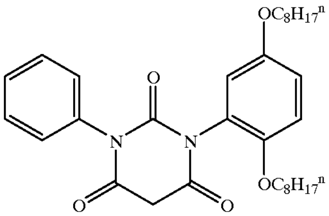
C-17
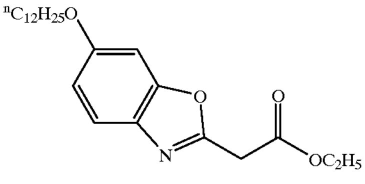
-continued
C-18
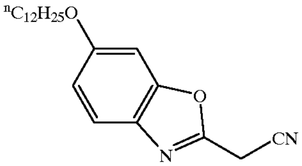
C-19
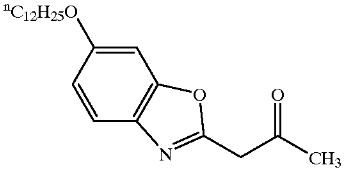
C-20
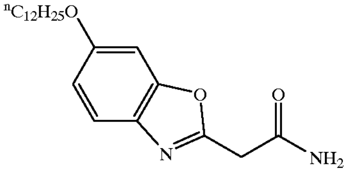
C-21
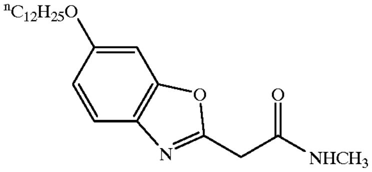
C-22
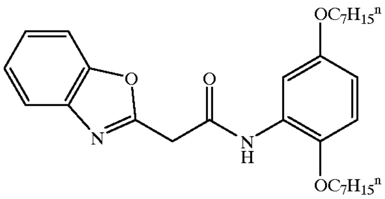
C-23
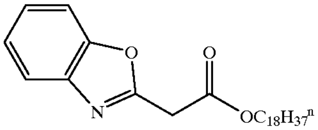
C-24
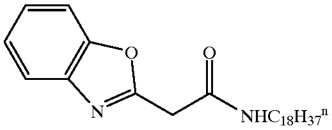
C-25
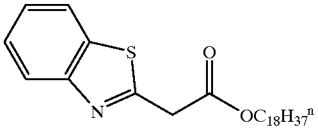

-continued
C-26
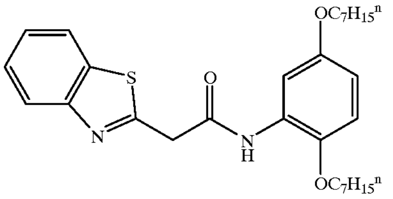
C-27
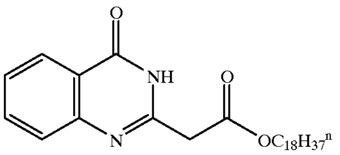
C-28
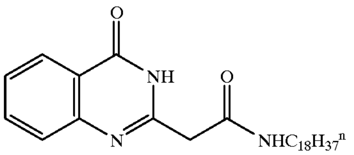
C-29
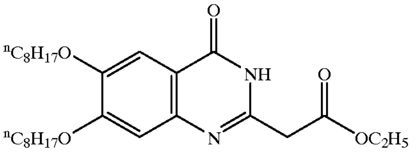
C-30
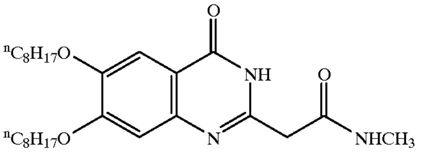
C-31
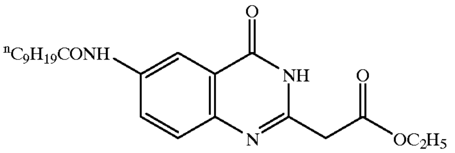
C-32
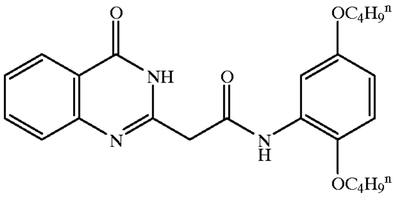
C-33
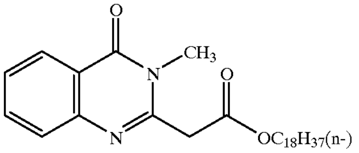
-continued
C-34
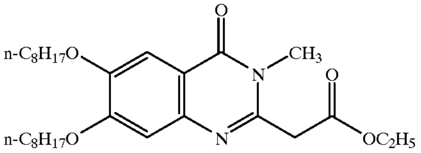
C-35
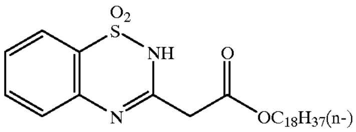
C-36
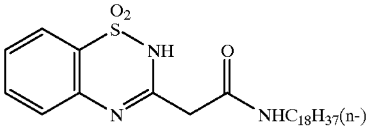
C-37
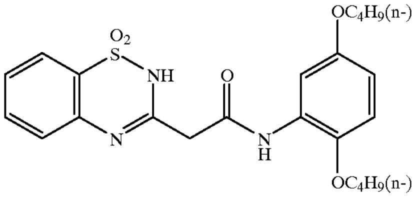
C-38
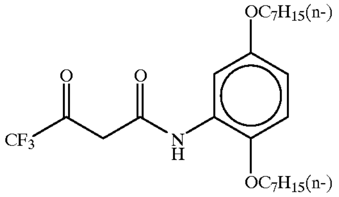
C-39
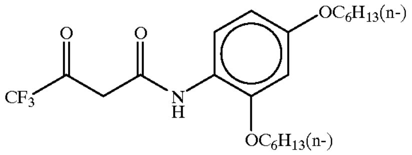
C-40
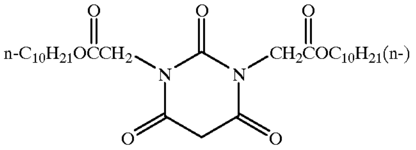
C-41
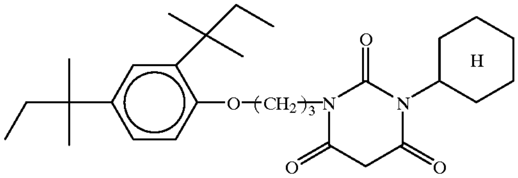

-continued

C-42

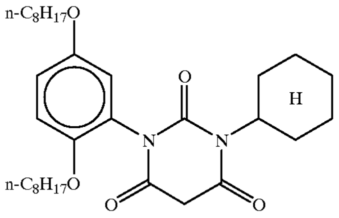

C-43

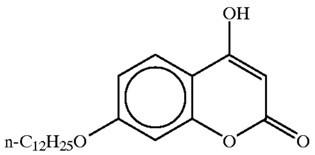

C-44

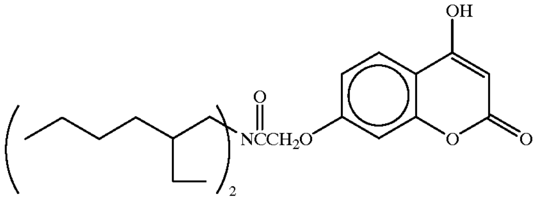

C-45

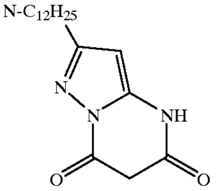

C-46

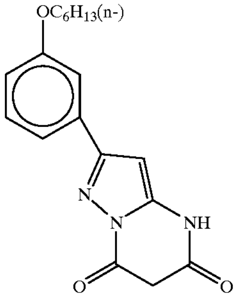

C-47

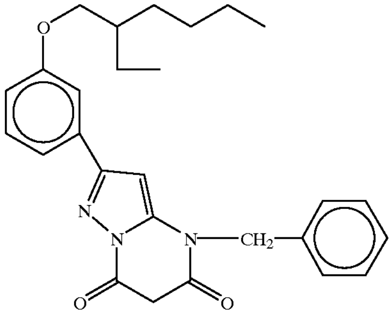

-continued

C-48

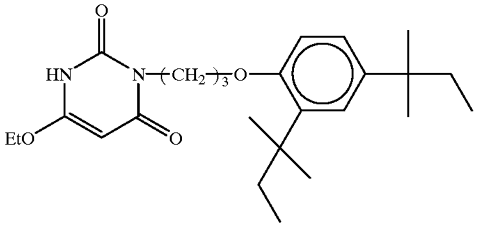

C-49

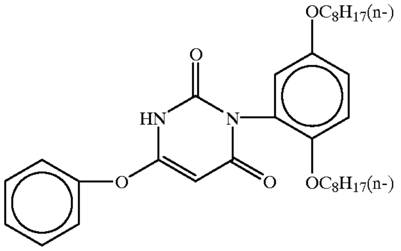

In the heat-sensitive recording materials of the present invention, in order to improve storability before use, it is preferable to encapsulate the diazonium salt in microcapsules.

It is necessary that the walls of microcapsules formed by the polymer is impermeable at room temperature but becomes permeable upon heating. In particular, a polymer having a glass transition temperature in the range of from 60 to 200° C. is preferable. Examples thereof include polyurethane, polyurea, polyamide, polyester, a urea-formaldehyde resin, a melamine resin, polystyrene, a styrene-methacrylate copolymer, a styrene-acrylate copolymer, and mixtures of these.

For example, when microcapsules have walls made up of a urea resin or a urethane resin having a glass transition temperature slightly higher than room temperature, the walls of microcapsules show material impermeability at room temperature but show a material permeability at the glass transition temperature or higher. The microcapsules are called "thermally responsive microcapsules" and are useful in heat-sensitive recording materials. That is, with the heat-sensitive recording material having formed on a support a heat-sensitive recording layer containing a coupling component and a base together with the thermally responsive microcapsules containing the diazonium salt, the diazonium salt can be stably kept for a long period of time before use and also color images can be easily formed by heating. The images can also be fixed by light irradiation.

The formation of microcapsules can be carried out using a known method. In a general method of encapsulating the diazonium salt in microcapsules, the diazonium salt is dissolved in a hydrophobic solvent (oil phase), the solution is added to an aqueous solution (aqueous phase) of a water-soluble polymer followed by emulsifying with a homogenizer and the like. On the other hand, prior to the above-described procedure, a monomer or a prepolymer which becomes the wall material of microcapsules is previously added to the oil phase side and/or the aqueous phase side, whereby a polymerization reaction is caused or a polymer is deposited at the interface between the oil phase and the aqueous phase to form the walls of a polymer. Thus, microcapsules containing the diazonium salt are prepared.

These methods are described in detail, for example, in Asashi Kondo, "*Microcapsules*", published by Nikkan Kogyo Shinbun-sha, 1970 and Tamotsu Kondo, et al., "*Microcapsules*", published by Sankyo Shuppan, 1977.

As a formation method of microcapsules in the present invention, an interfacial polymerization method and an internal polymerization method are suitable. The details of the formation method of microcapsules and the practical examples of the reactants are described in U.S. Pat. Nos. 3,726,804; 3,796,669, etc. For example, when polyurea or polyurethane is used as a capsule wall material, polyisocyanate and a second substance (for example, polyol and polyamine) forming capsule walls by reacting with the polyisocyanate are mixed in an aqueous medium or an oily medium for encapsulating. They are emulsified in water, and then heated, whereby a polymerization reaction occurs at the interface between the oil phase and the aqueous phase to form walls of microcapsules. In addition, even when the addition of the above-described second substance is omitted, polyurea is formed.

For the walls of microcapsules, various materials such as crosslinked gelatin, alginates, celluloses, urea resins, urethane resins, melamine resins, nylon resins, etc., can be used. In the present invention, the polymer forming the walls of microcapsules is preferably at least one kind selected from urethane resins and urea resins.

The production method of the diazonium salt-containing microcapsules (polyurea-polyurethane walls) in the present invention is explained below.

First, the diazonium salt is dissolved or dispersed in a hydrophobic organic solvent which becomes the microcapsule core. As the organic solvent in this case, at least one kind of a solvent selected from halogenated hydrocarbons, carboxylic acid esters, carboxamides, phosphoric acid esters, carbonic acid esters, ketones, ethers, alkylated biphenyls, alkylated terphenyls, and alkylated naphthalenes is preferable. Into the coresolvent is further added apolyhydric isocyanate as the wall material (oil phase).

On the other hand, as the aqueous phase, an aqueous solution having dissolved therein a water-soluble polymer such as polyvinyl alcohol, gelatin, etc., is prepared. Then after adding thereto the above-described oil phase, they are emulsified and dispersed by a means such as a homogenizer, etc. In this case, the water-soluble polymer functions as a stabilizer for the emulsification and dispersion. To carry out the emulsification and dispersion more stably, a surface active agent may be added to at least one of the oil phase and the aqueous phase.

The amount of the polyhydric isocyanate used is determined such that the mean particle size of the microcapsules is from 0.3 to 12 $\mu$m and the wall thickness is from 0.01 to 0.3 $\mu$m. The dispersed particle sizes are generally from about 0.2 to 10 $\mu$m. In the emulsified dispersion, the polymerization reaction occurs at the interface of the oil phase and the aqueous phase to form polyurea walls.

When polyol is previously added into the aqueous phase, the polyhydric isocyanate reacts with the polyol, whereby polyurethane walls can be formed. To accelerate the reaction rate, it is preferable to keep the reaction temperature high or to add a suitable polymerization catalyst. The polyhydric polyisocyanates, polyols, reaction catalysts, and polyamines for forming a part of walls of microcapsules, etc., are described in detail, for example, in Keiji Iwata, "*Polyurethane Handbook*", published by Nikkan Kogyo Shinbun-sha, 1987.

As the hydrophobic organic solvent in the case of dissolving the diazonium salt and forming the cores of microcapsules described above, an organic solvent having a boiling point of from 100 to 300° C. is preferable. Specific examples include an alkyl naphthalene, an alkyl diphenylethane, an alkyl diphenylmethane, an alkyl biphenyl, chlorinated paraffin, tricresyl phosphate, maleic acid esters, adipic acid esters, sulfuric acid esters, and sulfonic acid esters. They can be used singly or as a mixture of two or more kinds thereof.

When the solubility of the diazonium salt to be encapsulated in the solvents is low, a low-boiling solvent having a high solubility for the diazonium salt used can also be used. Specific examples of the low-boiling solvent include ethyl acetate, butyl acetate, methylene chloride, tetrahydrofuran, and acetone. Also, when only a low-boiling solvent is used, during the microencapsulation reaction, the solvent is evaporated off and so-called coreless microcapsules are formed wherein the capsule wall and the diazonium salt integrally exist.

As the polyhydric isocyanate compound used as the raw material for the walls of microcapsules, a compound having a three or higher isocyanato group is preferable but a difunctional isocyanate compound may also be used. Specifically, there are the dimers or trimers (biulets or isocyanurates) of a diisocyanate such as xylene diisocynate or the hydrogenated product thereof, hexamethylene diisocyanate, tolylene diisocyanate or the hydrogenated product thereof, etc., as the main raw material; the polyfunctional isocyanate compounds obtained as the adducts of the above-described diisocyanates and a polyol such as trimethylolpropane, etc.; formalin condensate of benzene isocyanate; etc.

Furthermore, a polyol or a polyamine is added to the hydrophobic solvent which becomes the cores of microcapsules or to a water-soluble high molecular compound solution which becomes a disperse medium and it can be used as one of the raw materials for the walls of microcapsules. Specific examples of these polyols or polyamines include propylene glycol, glycerol, trimethylolpropane, triethanolamine, sorbitol, and hexamethylenediamine. When a polyol is added, polyurethane walls are formed.

As the water-soluble polymer used for the water-soluble polymer solution for dispersing the oil phase of microcapsules thus prepared, a water-soluble polymer having a solubility in water of at least 5 wt % at a temperature at which the system is emulsified is preferable. Practical examples thereof include polyvinyl alcohol and the modified materials thereof, polyacrylamide and the derivatives thereof, an ethylene-vinyl acetate copolymer, a styrene-maleic anhydride copolymer, an ethylene-maleic anhydride copolymer, an isobutylene-maleic anhydride copolymer, polyvinyl pyrrolidone, an ethylene-acrylic acid copolymer, a vinyl acetate-acrylic acid copolymer, carboxymethyl cellulose, methyl cellulose, casein, gelatin, starch derivatives, gum arabic, and sodium alginate.

It is preferable that these water-soluble polymers have no or low reactivity with an isocyanate compound and, for example, in the case of using a water-soluble polymer having a reactive amino group in the molecule chain, such as gelatin, it is necessary to get rid of the reactivity by previously modifying the polymer.

Also, in the case of adding a surface active agent, the addition amount of the surface active agent is preferably from 0.1% to 5%, and particularly preferably from 0.5% to 2% of the weight of the oil phase.

For the emulsification, a known emulfying means such as a Manton-Gaulin, a homogenizer, an ultrasonic disperser, a dissolver, a KD mill, etc., can be used. After the emulsification, the emulsified product is heated to a temperature of from 30 to 70° C. to accelerate the microcapsule wall forming reaction. To prevent the flocculation of microcapsules with each other during the reaction, it is necessary to lower the possibility of collision of the microcapsules with each other by adding water or by stirring well.

Also, during the reaction, a dispersant may be added to prevent flocculation. With the progress of the polymerization reaction, the generation of a carbonic acid gas is observed and with the cessation of the generation of the gas, the capsule wall formation reaction can be considered to be finished. Usually, by reacting for several hours, the desired diazonium salt-containing microcapsules can be obtained.

In the heat-sensitive recording material of the present invention, an organic base is added to accelerate the coupling reaction between the diazonium salt and the coupling component. These organic bases may be added singly or as a combination of two or more kinds thereof. Examples of the basic substances include nitrogen-containing compounds such as tertiary amines, piperidines, piperazines, amidines, formamidines, pyridines, guanidines, morpholines, etc. Also, the basic materials described in Japanese Patent Application (JP-B) No. 52-46806, Japanese Patent Application Laid-Open (JP-A) Nos. 62-70082; 57-169745; 60-94381; 57-123086; 58-1347901; and 60-49991; Japanese Patent Application (JP-B) Nos. 2-24916 and 2-28479, Japanese Patent Application Laid-Open (JP-A) Nos. 60-165288 and 57-185430 can be used.

In these compounds, piperazines such as N,N'-bis(3-phenoxy-2-hydroxypropyl)piperazine, N,N'-[3-(p-methylphenoxy)-2-hydroxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxyprpyl]piperazine, N-3-(β-naphthoxy)-2-hydroxypropyl-N'-methylpiperazine, 1,4-bis{[3-(N-methylpiperazino)-2-hydroxy]propyloxy}benzene, etc.; morpholines such as N-[3-(β-naphthoxy)-2-hydroxy]propylmorpholine, 1,4-bis(3-morpholino-2-hydroxypropyloxy)benzene, 1,3-bis(3-morpholino-2-hydroxypropyloxy)benzene, etc.; piperidines such as N-(3-phenoxy-2-hydroxypropyl)piperidine, N-dodecylpiperidine, etc.; guanidines such as triphenylguanidine, tricyclohexylguanidine, dicyclohexylphenylguanidine, etc., are preferable.

In the heat-sensitive recording materials of the present invention, it is preferable that the amount of the coupling component used for every part by weight of the diazonium salt and the amount of the organic base used for every part by weight of the diazonium salt are each from 0.1 to 30 parts by weight.

In the heat-sensitive recording materials of the present invention, in addition to the above-described organic base, a color formation aid can be added for the purpose of accelerating the color formation reaction.

The color formation aid is a material that increases the density of color formation when recording by heating or lowers the minimum color formation temperature and makes the diazonium salt more liable to react with the coupling component by lowering the melting points of the coupling component, the organic base, and the diazonium salt, etc., and by lowering the softening point of walls of microcapsules.

As the materials included in the color formation aid used for the heat-sensitive recording material of the present invention, there are, for example, phenol derivatives, naphthol derivatives, alkoxy-substituted benzenes, alkoxy-substituted naphthalenes, aromatic ethers, thioethers, esters, amides, ureides, urethanes, sulfonamide compounds, hydroxy compounds, etc., which are used in the color formation layers such that the thermal printing is carried out quickly and completely at low energy expenditure.

The color formation aids which can be used for the heat-sensitive recording materials of the present invention also include heat-melting substances. The heat-melting substance is a substance which is a solid at normal temperature, has a melting point of from 50 to 150° C., and is melted by heating, and dissolves the diazonium salt, the coupling component, or the organic base. Specific examples of these compounds include carboxamides, N-substituted carboxamides, ketone compounds, urea compounds, esters, etc.

In the heat-sensitive recording materials of the present invention, it is preferable to use the known antioxidants, etc., shown below for the purposes of improving the color fastness of the thermally color-developed images to light and heat or reducing yellowing of the unprinted portions through exposure to light after fixing.

The above-described antioxidants are described, for example, in European Patent Application (EP-A) Nos. 223739; 309401; 309402; 310551; 310552; and 459410; German Patent Application (DE-A) No. 3,435,443; Japanese Patent Application Laid-Open (JP-A) Nos. 54-48535; 62-262047; 63-11536; 63-163351; 2-262654; 2-71262; 3-121449; 5-61166; and 5-119449; U.S. Pat. Nos. 4,814,262 and 4,980,275.

In the heat-sensitive recording materials of the present invention, it is effective to further use various kinds of known additives already used for conventional heat-sensitive recording materials and pressure-sensitive recording materials. Practical examples of these antioxidants are described in Japanese Patent Application Laid-Open (JP-A) Nos. 60-107384; 60-107383; 60-125470; 60-125471; 60-125472; 60-287485; 60-287486; 60-287487; 60-287488; 61-160287; 61-185483; 61-211079; 62-146678; 62-146680; 62-146679; 62-282885; 63-051174; 63-89877; 63-88380; 63-088381; 63-203372; 63-224989; 63-251282; 63-267594; 63-182484; 1-239282; 4-291685; 4-291684; 5-188687; 5-188686; 5-110490; 5-1108437; and 5-170361, Japanese Patent Application (JP-B) Nos. 48-043294 and 48-033212.

Specifically, there are 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4-tetrahydroquinoline, nickel cyclohexanecarboxylate, 2,2-bis(4-hydroxyphenyl)propane, 1,1-bis(4-hydroxyphenyl)-2-ethylhexane, 2-methyl-4-methoxydiphenylamine, 1-methyl-2-phenylindole, and the like.

The addition amount of the antioxidant is preferably from 0.05 to 100 parts by weight and particularly preferably from 0.2 to 30 parts by weight for every part by weight of the diazonium salt.

The above-described known antioxidants can be used in the microcapsules together with the diazonium salt, or can be used as a solid dispersion together with the coupling component, the organic base, and others, such as a color formation aid, etc., or as an emulsion with a proper emulsification aid, or can be used in both forms. Also, as a matter of course, the antioxidants can be used singly or as a mixture thereof. Also, the antioxidant can be added to a protective layer formed on the heat-sensitive recording layer.

These antioxidants need not always be added to the same layer. Furthermore, when these antioxidants are used as a combination of antioxidants, they are classified by structure. For example, anilines, alkoxybenzenes, hindered phenols, hindered amines, hydroquinone derivatives, phosphorus compounds, sulfurcompounds, and antioxidants having different structures may be combined or antioxidants having the same structure can be combined.

The coupling component used in the present invention can be used in union with the water-soluble polymer by solid-dispersing with a sand mill, etc. An organic base, and others such as a color formation aid, etc., can also be used, but it is preferable that after dissolving the coupling component in an organic solvent which is sparingly soluble or insoluble in water, the solution is mixed with an aqueous phase containing a surface active agent and/or the water-soluble polymer as a protective colloid to form an emulsion. From the view point of facilitating emulsification and dispersion, it is preferable to use a surface active agent.

The organic solvent used in this case can be suitably selected from the high-boiling oils described in Japanese Patent Application Laid-Open (JP-A) No. 2-141279.

Of these high-boiling oils, from the view point of the emulsification stability, the use of esters is preferable and in particular, the use of tricresyl phosphate is preferable.

These oils can be combined or even used with other oils.

To the above-described organic solvent can be further added an auxiliary solvent as a low-boiling dissolution aid. As such an auxiliary solvent, for example, ethyl acetate, isopropyl acetate, butyl acetate and methylene chloride are particularly preferable. In some cases, no high-boiling oil is added and only the low-boiling auxiliary solvent is used.

The water-soluble polymer which is added as a protective colloid to the aqueous phase mixed with the oil phase containing these components can be suitably selected from known anionic polymers, nonionic polymers, and amphoteric polymers. The preferable water-soluble polymers include, for example, polyvinyl alcohol, gelatin, and cellulose derivatives.

Also, the surface active agent which is incorporated in the aqueous phase is properly selected from anionic or nonionic surface active agents which do not cause precipitation or flocculation by acting with the above-described protective colloid. Preferred surface active agents include a sodium alkylbenzene sulfonate, a sodium alkyl sulfate, a sodium dioctyl sulfosuccinate, a polyalkylene glycol (for example, polyoxyethylene nonylphenyl ether), and the like.

In the heat-sensitive recording material of the present invention, a radical generating agent (i.e., a compound generating a free radical when irradiated by light), which is used for photopolymerization compositions, etc., can be added for the purpose of reducing yellow discoloring of the background area after recording. The radical generating agent includes aromatic ketones, quinones, benzoin, benzoin ethers, azo compounds, organic disulfides, acyloxim esters, etc. The addition amount of the radical generating agent is preferably from 0.01 to 5 parts by weight for every part by weight of the diazonium salt.

Also, similarly, for the purpose of reducing yellow discoloring, a polymerizable compound having an olefinic unsaturated linkage (hereinafter, referred to as a vinyl monomer) can be used for the heat-sensitive recording material of the present invention. A vinyl monomer is a compound having at least one olefinic unsaturated linkage (a vinyl group, a vinylidene group, etc.) in the chemical structure and has a monomer or prepolymer chemical form. Examples thereof include unsaturated carboxylic acids or the salts thereof, the esters of unsaturated carboxylic acids and aliphatic polyhydric alcohols, and the amides of unsaturated carboxylic acids and aliphatic polyhydric amines. The vinyl monomer is used in an amount of from 0.2 to 20 parts by weight for every part by weight of the diazonium salt.

The above-described radical generating agent and vinyl monomer can be used in microcapsules together with the diazonium salt.

In the heat-sensitive recording materials of the present invention, in addition to the above-described materials, citric acid, tartaric acid, oxalic acid, boric acid, phosphoric acid, pyrophosphoric acid, etc., can be added as an acid stabilizer.

For the heat-sensitive recording material of the present invention, a coating solution containing the diazonium-containing microcapsules, the coupling component, the organic base, and other additive(s) is prepared and coated onto a support such as paper, a synthetic resin film, etc., by a coating method such as bar coating, blade coating, air-knife coating, gravure coating, roll coating, spray coating, dip coating, curtain coating, etc., followed by drying to form a heat-sensitive layer containing solid components of from 2.5 to 30 $g/m^2$.

In the heat-sensitive recording material of the present invention, the microcapsules, the coupling component, the organic base, etc., may exist in the same layer but a laminated layer-type structure wherein the above-described components exist in different layers may be employed. Also, after forming an interlayer on a support, the heat-sensitive layer or layers can be coated thereon as described in Japanese Patent Application No. 59-177669.

As the binder used for the heat-sensitive recording material of the present invention, known water-soluble polymers, or latexes, etc., can be used. The water-soluble polymers used as a binder include methyl cellulose, carboxymethyl cellulose, hydroxyethyl cellulose, hydroxypropyl cellulose, starch derivatives, casein, gum arabic, gelatin, an ethylene-maleic anhydride copolymer, a styrene-maleic anhydride copolymer, polyvinyl alcohol, epichlorohydrin-modified polyamide, an isobutylene-maleic anhydride-salicylic acid copolymer, polyacrylic acid, polyacrylamide, etc., and the modified products thereof. Also, the latexes include a styrene-butadiene rubber latex, a methyl acrylate-butadiene rubber latex, a vinyl acetate emulsion, and the like.

As pigments which can be used for the heat-sensitive recording materials of the present invention, known pigments such as organic pigments and inorganic pigments can be used. Specifically, there are kaolin, calcined kaolin, talc, agalmatolite, diatomaceous earth, calcium carbonate, aluminum hydroxide, magnesium hydroxide, zinc oxide, lithopone, amorphous silica, colloidal silica, calcined gypsum, silica, magnesium carbonate, titanium oxide, alumina, barium carbonate, barium sulfate, mica, microballoon, a urea-formalin filler, polyester particles, a cellulose filler, etc.

In the heat-sensitive recording materials of the present invention, if necessary, various kinds of additives such as known waxes, antistatic agents, antifoaming agents, electrically conductive agents, fluorescent dyes, surface active agents, UV absorbers and the precursors thereof, etc., can be used.

In the heat-sensitive recording material of the present invention, if necessary, a protective layer may be formed on the heat-sensitive recording layer as described above. The protective layer may be, if necessary, a laminate of two or more layers. As the material used for the protective layer, water-soluble high-molecular compounds such as polyvinyl alcohol, carboxy-modified polyvinyl alcohol, a vinyl acetate-acrylamide copolymer, silicon-modified polyvinyl alcohol, starch, denatured starch, methyl cellulose, carboxymethyl cellulose, hydroxymethyl cellulose, gelatins, gum arabic, casein, a styrene-maleic anhydride copolymer hydrolyzate, a styrene-maleic anhydride copolymer half ester hydrolyzate, an isobutylene-maleic anhydride copolymer hydrolyzate, polyacrylamide derivatives, polyvinyl pyrrolidone, sodium polystyrenesulfonate, sodium alginate, etc.; and latexes such as a styrene-butadiene rubber latex, an acrylonitrile-butadiene rubber latex, a methyl acrylate-butadiene rubber latex, a vinyl acetate emulsion, etc., are used. By crosslinking the water-soluble polymer in the protective layer, the storage stability of the heat-sensitive recording material can be improved. As the crosslinking agent, a known crosslinking agent can be used. Specific examples of the crosslinking agent include water-soluble initial condensates such as N-methylolurea, N-methylolmelamine, urea-formalin, etc.; dialdehyde compounds such as glyoxal, glutaraldehyde, etc.; inorganic crosslinking agents such as boric acid, borax, etc.; and polyamide epichlorohydrin, etc. Furthermore, for the protective layer, known pigments, metallic soaps, waxes, surface active agents, etc., can be used.

The coating amount of the protective layer is preferably from 0.2 to 5 $g/m^2$, and more preferably from 0.5 to 2 $g/m^2$. Also, the thickness of the protective layer is preferably from 0.2 to 5 $\mu$m, and particularly preferably from 0.5 to 2 $\mu$m.

As the support used for the heat-sensitive recording material of the present invention, paper supports used for conventional carbonless paper, thermal recording paper, dry-type or wet-type diazo-type paper, etc., can be used. Specifically, acid paper, neutralized paper, coated paper, plastic film-laminated paper obtained by laminating a plastic such as polyethylene, etc., onto paper, synthetic paper, and plastic films of polyethylene terephthalate, polyethylene naphthalate, etc. can be used. Also, in the heat-sensitive recording material of the present invention, to correct the curl balance of the support or to prevent the entrance of chemicals from the back surface of the support, a backcoat layer may be formed on the back surface of the support and the backcoat layer can be formed in the same manner as the above-described protective layer. Furthermore, it is possible to form a label by forming a releasing paper at the back surface of the support via an adhesive layer.

In the heat-sensitive recording material of the present invention, by laminating heat-sensitive recording layers each showing a different developed hue, a multicolor heat-sensitive recording material is obtained. Furthermore, as the heat-sensitive recording layers to be laminated, there are heat-sensitive recording layers each containing a photodecomposing diazonium salt. Such multicolor heat-sensitive recording materials (light-sensitive and heat-sensitive recording materials) are described in Japanese Patent Application Laid-Open (JP-A) Nos. 4-135787; 4-144787; 4-144785; 4-194842; 4-247447; 4-247448; 4-340540; 4-340541; and 5-34860, Patent Application No. 7-316280, etc.

There is no particular restriction on the layer structure but a multicolor heat-sensitive recording material having laminated layers of heat-sensitive recording layers each having a combination of the diazonium salt each having a different light-sensitive wavelength and the coupler coloring in each different hue by thermally reacting with the diazonium salt is particularly preferable. For example, the multicolor heat-sensitive recording material of the present invention has, from the support side, a first heat-sensitive recording layer (layer A) containing the diazonium salt in the present invention having the maximum absorption wavelength shorter than 350 nm and the coupler undergoing color formation by thermally reacting with said diazonium salt, a second heat-sensitive recording layer (layer B) containing the diazonium salt having the maximum absorption wavelength of 360 nm±20 nm and the coupler undergoing color formation by thermally reacting with the diazonium salt, and a third heat-sensitive recording layer (layer C) containing the diazonium salt having the maximum absorption wavelength of 400 nm±20 nm and the coupler undergoing color formation by thermally reacting with the diazonium salt. In this example, by selecting the developed hues of the heat-sensitive recording layers such that the hues become three primary colors of the subtractive color process, i.e., yellow, magenta, and cyan, full color image recording becomes possible.

In the layer structure of the case of the full color recording material, the coloring layers of yellow, magenta, and cyan may be laminated in any desired order but from the viewpoint of color reproducibility, it is preferable to laminate the heat-sensitive recording layers in the order of yellow, cyan, and magenta or of yellow, magenta, and cyan from the support side.

In the recording method of the multicolor heat-sensitive recording material, first, the third heat-sensitive recording layer (layer C) is heated to color the diazonium salt and the coupler contained in the layer by thermally reacting with them. Then, after irradiating the recording material with light having a wavelength of 400±20 nm to decompose the unreacted diazonium salt contained in the layer C, sufficient heat for coloring the second heat-sensitive layer (layer B) is applied to color the diazonium salt and the coupler contained in the layer by thermally reacting them. In this case, the layer C is also strongly heated but because the diazonium salt in the layer has already been decomposed and the coloring faculty thereof has been lost, the diazonium salt is not colored. Furthermore, the recording material is irradiated by light having a wavelength of 360±20 nm to decompose the diazonium salt contained in the layer B, and finally sufficient heat for coloring the first heat-sensitive recording layer (layer A) to color the diazonium salt and the coupler contained in the layer. In this case, the layer C and the layer B of the heat-sensitive recording layers are also strongly heated but because the diazonium salts in said layers have already been decomposed and coloring faculties thereof have been lost, they do not color. It is preferable that the heat-sensitive recording material of the present invention is formed as the multicolor heat-sensitive recording material as described above.

In the case of the multicolor heat-sensitive recording material, to prevent the occurrence of color mixing of the heat-sensitive recording layers each other, an interlayer may be formed between the recording layers. The interlayer is made up of a water-soluble polymer such as gelatin, phthalated gelatin, polyvinyl alcohol, polyvinyl pyrrolidone, etc., and may contain various suitable additives.

In the case of the multicolor heat-sensitive recording material having a photofixing type heat-sensitive recording layer on the support, it is desirable to have a photo-transmittance regulating layer and/or the protective layer on the above-described layer. The photo-transmittance regulating layer is described in Japanese Patent Application Laid-Open (JP-A) Nos. 9-39395 and 9-39396, Patent Application No. 7-208386, etc.

In the present invention, because the photo-transmittance regulating layer contains a component which functions as a precursor for a UV absorber and does not function as the UV absorber before the irradiation of the light of the wavelengths in the region required for fixing, the photo-transmittance regulating layer has a high photo-transmittance, sufficiently transmit the light of the wavelength in the region necessary for fixing, and also has a high transmittance for visible rays, whereby it gives no hindrance for fixing the heat-sensitive recording layers.

The precursor for the UV absorbent functions as the UV absorbent by reacting with light or heat after finishing the irradiation of the light of the wavelength necessary for fixing the photo-fixing type heat-sensitive recording layer by the irradiation of the light, the greater part of the light of the wavelength in the ultraviolet region is absorbed by the UV absorber, the transmittance is lowered, and the light fastness of the heat-sensitive recording material is improved but because the UV absorber does not have an absorption effect of visible rays, the transmittance of visible rays is not substantially changed.

The photo-transmittance regulating layer can be formed in the photo-fixing type heat-sensitive recording material of at least one layer, it is most desirable to form the layer between the photo-fixing type heat-sensitive recording layer and the protective layer but the photo-transmittance regulating layer may also function as the protective layer.

In the present invention, it is desirable that two photo-fixing type heat-sensitive recording layers each containing the diazonium salt having each a different maximum absorption wavelength and the coupling component undergoing color formation by reacting the diazonium salt on the above-described heat-sensitive recording layers and further the photo-transmittance regulating layer and the protective layer are successively formed on the layer.

In the heat-sensitive recording material of the present invention, the density of color formation of the color-developed images is very high and the images obtained are fast. Moreover, the heat-sensitive recording material of the present invention is excellent in the storage stability to heat and light before use.

EXAMPLES

The present invention is further explained in detail below by the Examples but the invention is not limited thereby. In addition, in the Examples, all parts are by weight.

Example 1

(Preparation of diazonium salt-containing microcapsule solution A)

To 19 parts of ethyl acetate were added 2.8 parts of the diazonium salt (Compound 1-2) shown in Table 1 below and 10 parts of tricresyl phosphate and they were uniformly mixed. Then, to the mixed solution was added 7.6 parts of Takenate D110N (trade name, made by Takeda Chemical Industries, Ltd.) followed by mixing to obtain a solution I. Then, the above-described solution I was added to a mixed solution of 46 parts of an aqueous solution of 8% phthalated gelatin, 17.5 parts of water, and 2 parts of an aqueous solution of 10% sodium dodecylbenzenesulfonate and the mixture was emulsified and dispersed using a homogenizer for 10 minutes at 40° C. and 10,000 rpm. After adding 20 parts of water to the emulsion obtained followed by uniformly mixing, a microencapsulation reaction was carried out with stirring for 3 hours at 40° C. to provide a diazonium salt-containing microcapsule solution A. The mean particle size of the microcapsules was from 0.3 to 0.4 $\mu$m.

(Preparation of coupling component emulsion B)

In 10.5 parts of ethyl acetate were dissolved 3 parts of the coupling component (Compound C-16), 4 parts of triphenylguanidine, 8 parts of 4-hydroxybenzoic acid-2-ethylhexyl, 4 parts of 1,1-bis(4-hydroxyphenyl)-2-ethylhexane, 8 parts of 4,4'-(m-phenylenediisopropylidene)-diphenol, 0.48 parts of tricresyl phosphate, and 0.24 parts of diethyl maleate to obtain a solution II.

Then, the solution II was added to a uniform mixture of 49 parts of an aqueous solution of 15% lime-processed gelatin, 9.5 parts of an aqueous solution of 10% sodium dodecylbenzenesulfonate, and 35 parts of water at 40° C. and the mixture was emulsified and dispersed using a homogenizer for 10 minutes at 40° C. and 10,000 rpm. After stirring the emulsion obtained for 2 hours at 40° C. to remove ethyl acetate, water was added to the emulsion to provide a coupling component emulsion B.

(Preparation of heat-sensitive recording layer coating solution C)

By mixing 3.6 parts of the diazonium salt-containing microcapsule solution A, 3.3 parts of water, and 9.5 parts of the coupling component emulsion B, a heat-sensitive recording layer coating solution C was obtained.

(Preparation of protective layer coating solution D)

By uniformly mixing 32 parts of an aqueous solution of 10% polyvinyl alcohol (polymerization degree: 1,700, saponification degree: 88%) and 36 parts of water, a protective layer coating solution D was obtained.

(Coating)

After successively coating the heat-sensitive recording layer coating solution C and the protective layer coating solution D on a support for photographic paper obtained by laminating polyethylene on wood-free paper, they were dried at 50° C. to obtain the desired heat-sensitive recording material. The coating amounts of the heat-sensitive recording layer and the protective layer as solid components were 8.0 $g/m^2$ and 1.2 $g/m^2$, respectively.

(Coloring test)

A thermal head (Type KST, manufactured by Kyocera Corporation) was used to perform thermal printing onto the heat-sensitive recording material to obtain images after setting the power to be applied and the pulse width for the thermal head such that the recording energy per unit area became 50 $mJ/mm^2$ and thereafter, the imaged sample was wholly irradiated with ultraviolet light for 10 seconds using a ultraviolet lamp having a light emitting central wavelength of 420 nm and an output power of 40 W. The density of color formation and the background density in this case were measured. The density of the image portion in the usable range is at least 1.2 and the density of the background portion in the usable range is 0.1 or lower.

(Light fastness test)

After irradiating the heat-sensitive recording material after recording at 30,000 lux for 72 hours using a fluorescent lamp fastness test machine, the densities of the image portion and the background portion were measured. The smaller the reduction in density of the image portion is and the smaller the increase in density of the background portion is after irradiation by the fluorescent lamp, the better the light fastness is.

(Evaluation of storability before use)

The heat-sensitive recording material before recording was forcibly stored for 72 hours under the conditions of 40° C. and 90% RH. After the forcible storage, the above-described color formation test was applied and the densities of the image portion and the background portion were measured.

The smaller the reduction in density of the image portion is and the smaller the increase in density of the background portion is after the forcible storage, the better the storage before use (shelf life) is.

(Light stability test)

The heat-sensitive recording material before recording was wholly irradiated with ultraviolet light for 10 seconds using an ultraviolet lamp having a central wavelength of 365 nm and an output power of 40 W. The sample was thermally printed as the case of the above-described coloring test to obtain images and the density of color formation in this case was measured. The smaller the reduction in density of color formation after the irradiation by the ultraviolet lamp is, the better the sample is in light stability.

(Density measurement)

The densities of the image portion and the background portion were measured using a Macbeth reflection densitometer RD 918 at the Y position.

Example 2

By following the same procedure as Example 1 except that Compound 1-9 was used as the diazonium salt, a heat-sensitive recording material was prepared and evaluated.

Example 3

By following the same procedure as Example 1 except that Compound 1-10 was used as the diazonium salt, a heat-sensitive recording material was prepared and evaluated.

Example 4

By following the same procedure as Example 1 except that Compound 1-7 was used as the diazonium salt, a heat-sensitive recording material was prepared and evaluated.

Example 5

By following the same procedure as Example 1 except that Compound 1-5 was used as the diazonium salt, a heat-sensitive recording material was prepared and evaluated.

Example 6

By following the same procedure as Example 1 except that Compound 1-15 was used as the diazonium salt, a heat-sensitive recording material was prepared and evaluated.

Example 7

By following the same procedure as Example 1 except that Compound 1-16 was used as the diazonium salt, a heat-sensitive recording material was prepared and evaluated.

Example 8

By following the same procedure as Example 1 except that Compound 1-18 was used as the diazonium salt, a heat-sensitive recording material was prepared and evaluated.

Example 9

By following the same procedure as Example 1 except that Compound 5-1 was used as the diazonium salt, a heat-sensitive recording material was prepared and evaluated.

Example 10

By following the same procedure as Example 1 except that Compound 5-2 was used as the diazonium salt, a heat-sensitive recording material was prepared and evaluated.

Example 11

By following the same procedure as Example 1 except that Compound 5-3 was used as the diazonium salt, a heat-sensitive recording material was prepared and evaluated.

Example 12

By following the same procedure as Example 1 except that Compound 5-4 was used as the diazonium salt, a heat-sensitive recording material was prepared and evaluated.

Example 13

By following the same procedure as Example 1 except that Compound C-40 was used as the coupling component, a heat-sensitive recording material was prepared and evaluated.

Example 14

By following the same procedure as Example 1 except that Compound C-44 was used as the coupling component, a heat-sensitive recording material was prepared and evaluated.

Example 15

By following the same procedure as Example 1 except that Compound C-46 was used as the coupling component, a heat-sensitive recording material was prepared and evaluated.

Example 16

By following the same procedure as Example 1 except that Compound C-49 was used as the coupling component, a heat-sensitive recording material was prepared and evaluated.

Comparative Example 1

By following the same procedure as Example 1 except that a diazonium salt B-1 described below was used, a heat-sensitive material was prepared and evaluated.

Comparative Example 2

By following the same procedure as Example 1 except that a diazonium salt B-2 described below was used, a heat-sensitive material was prepared and evaluated.

B-1

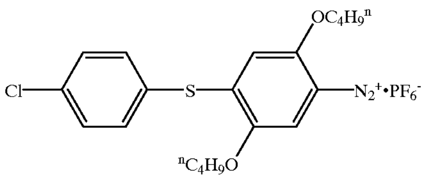

-continued

B-2

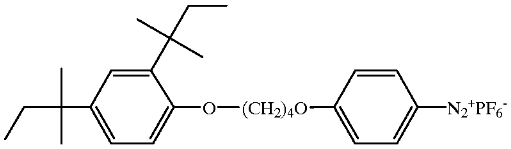

The results are shown below.

TABLE 1

| | Diazonium salt | Coupling component | Density of color formation | Density of image portion after light fastness test | Density of image portion after storability test before use | Density of background portion | Density of background portion after light fastness test | Density of background portion after storability test before use |
|---|---|---|---|---|---|---|---|---|
| Example 1 | 1-2 | C-16 | 1.28 | 1.18 | 1.17 | 0.07 | 0.10 | 0.09 |
| Example 2 | 1-9 | C-16 | 1.30 | 1.21 | 1.19 | 0.07 | 0.10 | 0.09 |
| Example 3 | 1-10 | C-16 | 1.29 | 1.20 | 1.20 | 0.07 | 0.10 | 0.09 |
| Example 4 | 1-7 | C-16 | 1.27 | 1.15 | 1.16 | 0.07 | 0.09 | 0.08 |
| Example 5 | 1-5 | C-16 | 1.24 | 1.20 | 1.18 | 0.07 | 0.09 | 0.09 |
| Example 6 | 1-15 | C-16 | 1.27 | 1.20 | 1.19 | 0.07 | 0.10 | 0.09 |
| Example 7 | 1-16 | C-16 | 1.28 | 1.22 | 1.21 | 0.07 | 0.09 | 0.09 |
| Example 8 | 1-18 | C-16 | 1.26 | 1.24 | 1.22 | 0.07 | 0.10 | 0.09 |
| Example 9 | 5-1 | C-16 | 1.25 | 1.21 | 1.20 | 0.07 | 0.09 | 0.08 |
| Example 10 | 5-2 | C-16 | 1.29 | 1.25 | 1.23 | 0.07 | 0.09 | 0.08 |
| Example 11 | 5-3 | C-16 | 1.28 | 1.26 | 1.26 | 0.07 | 0.09 | 0.08 |
| Example 12 | 5-4 | C-16 | 1.27 | 1.23 | 1.22 | 0.07 | 0.10 | 0.08 |
| Example 13 | 1-2 | C-40 | 1.30 | 1.21 | 1.21 | 0.07 | 0.10 | 0.09 |
| Example 14 | 1-2 | C-44 | 1.32 | 1.20 | 1.22 | 0.07 | 0.10 | 0.10 |
| Example 15 | 1-9 | C-46 | 1.27 | 1.20 | 1.22 | 0.07 | 0.09 | 0.10 |
| Example 16 | 1-9 | C-49 | 1.28 | 1.21 | 1.23 | 0.07 | 0.09 | 0.09 |
| Comparative Example 1 | B-1 | C-16 | 1.01 | 0.67 | 0.71 | 0.08 | 0.15 | 0.11 |
| Comparative Example 2 | B-2 | C-16 | 1.19 | 1.05 | 0.91 | 0.07 | 0.10 | 0.10 |

TABLE 2

| | Diazonium salt | Coupling composition | Density of color formation before photo-decomposition property test | Density of color formation after photo-decomposition property test |
|---|---|---|---|---|
| Example 1 | 1–2 | C-16 | 1.28 | 1.28 |
| Example 2 | 1–9 | C-16 | 1.30 | 1.30 |
| Example 3 | 1–10 | C-16 | 1.29 | 1.29 |
| Example 4 | 1–7 | C-16 | 1.27 | 1.27 |
| Example 5 | 1–5 | C-16 | 1.24 | 1.24 |
| Example 6 | 1–15 | C-16 | 1.27 | 1.27 |
| Example 7 | 1–16 | C-16 | 1.28 | 1.28 |
| Example 8 | 1–18 | C-16 | 1.26 | 1.26 |
| Example 9 | 5–1 | C-16 | 1.25 | 1.25 |
| Example 10 | 5–2 | C-16 | 1.29 | 1.29 |
| Example 11 | 5–3 | C-16 | 1.28 | 1.28 |
| Example 12 | 5–4 | C-16 | 1.27 | 1.27 |
| Example 13 | 1–2 | C-40 | 1.30 | 1.30 |
| Example 14 | 1–2 | C-44 | 1.32 | 1.32 |
| Example 15 | 1–9 | C-46 | 1.27 | 1.27 |
| Example 16 | 1–9 | C-49 | 1.28 | 1.28 |
| Comparative Example 1 | B-1 | C-16 | 1.01 | 0.08 |
| Comparative Example 2 | B-2 | C-16 | 1.19 | 1.19 |

From the Examples and the Comparative Examples, it can be seen that the heat-sensitive recording materials of this invention give a high density of color formation of image portion and have excellent light fastness and storability before use. On the other hand, the conventional heat-sensitive materials (Comparative Examples 1 and 2) using known diazonium salts give a low density of color formation of image portions and are particularly inferior in light fastness and storability before use compared to the heat-sensitive recording materials of the present invention.

What is claimed is:

1. A heat-sensitive recording material having formed on a support a heat-sensitive recording layer containing a diazonium salt and a coupling component, wherein said diazonium salt is a compound represented by the following formula (1):

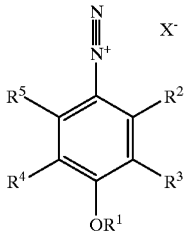

wherein $R^1$ represents an alkyl group or an aryl group; $R^2$, $R^3$, $R^4$ and $R^5$ each independently represents a hydrogen atom or an alkyl group, at least one of $R^2$, $R^3$, $R^4$, and $R^5$ represents an alkyl group, and $R^2$ and $R^3$, or $R^4$ and $R^5$, or $R^1$ and $R^3$, or $R^1$ and $R^4$, may combine with each other to form a ring; and $X^-$ represents an anion.

2. A heat-sensitive recording material according to claim 1, wherein said diazonium salt is a compound represented by the following formula (2):

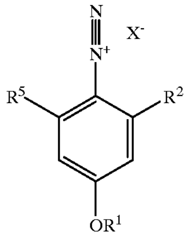

3. A heat-sensitive recording material according to claim 1, wherein said coupling component is a compound represented by the following formula (3):

$$E^1—CH_2—E^2$$

wherein $E^1$ and $E^2$ each independently represents an electron withdrawing group.

4. A heat-sensitive recording material according to claim 1, wherein said anion $X^-$ of the diazonium salt is at least one kind selected from the group consisting of a hexafluorophosphoric acid ion, a borofluoric acid ion, a chloride ion, a sulfuric acid ion, a polyfluoroalkylcarboxylic acid ion, a polyfluoroalkylsulfonic acid ion, a tetraphenylboric acid ion, an aromatic carboxylic acid ion, and an aromatic sulfonic acid ion.

5. A heat-sensitive recording material according to claim 1, wherein said diazonium salt is present in said heat-sensitive recording layer in an amount of from 0.02 to 5 $g/m^2$.

6. A heat-sensitive recording material according to claim 1, wherein at least one photo-transmission regulating layer containing a component which functions as a precursor for a UV absorber is further formed on said heat-sensitive recording layer.

7. A heat-sensitive recording material according to claim 1, wherein the diazonium salt is present in microcapsules.

8. A heat-sensitive recording material according to claim 7, wherein glass transition temperature of a high molecular substance forming the walls of said microcapsules is in the range of from 60 to 200° C.

9. A heat-sensitive recording material according to claim 8, wherein the high molecular substance forming the walls of said microcapsules is at least one member selected from a urethane resin and a urea resin.

10. A heat-sensitive recording material according to claim 7, wherein at least one photo-transmission regulating layer containing a component which functions as a precursor of a UV absorber is formed on said heat-sensitive recording layer.

11. A multicolor heat-sensitive recording material having formed on a support laminated heat-sensitive recording layers each having a combination of a diazonium salt each having a different photosensitive wavelength and a coupler coloring in each different hue by thermally reacting with the diazonium salt, wherein said diazonium salt includes a diazonium salt having a maximum absorption wavelength shorter than 350 nm and said diazonium salt having a maximum absorption wavelength shorter than 350 nm is a compound represented by the following formula (1):

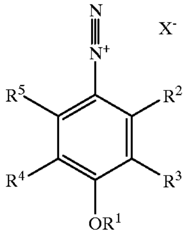

wherein $R^1$ represents an alkyl group or an aryl group; $R^2$, $R^3$, $R^4$ and $R^5$ each independently represents a hydrogen atom or an alkyl group, at least one of $R^2$, $R^3$, $R^4$, and $R^5$ represents an alkyl group, and $R^2$ and $R^3$, or $R^4$ and $R^5$, or $R^1$ and $R^3$, or $R^1$ and $R^4$, may combine with each other to form a ring; and $X^-$ represents an anion.

12. A multicolor heat-sensitive recording material according to claim 11, wherein said diazonium salt shown by the formula (1) is a compound represented by the following formula (2):

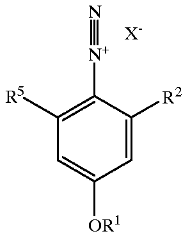

wherein $R^1$ represents an alkyl group or an aryl group; $R^2$ and $R^5$ each independently represents a hydrogen atom or an alkyl group, and at least one of $R^2$ and $R^5$ represents an alkyl group; and $X^-$ represents an anion.

13. A multicolor heat-sensitive recording material according to claim 11, wherein said coupling component is a compound represented by the following formula (3):

$$E^1—CH_2—E^2$$

wherein $E^1$ and $E^2$ each independently represents an electron withdrawing group.

14. A multicolor heat-sensitive recording material according to claim 11, wherein said diazonium salt is present in said heat-sensitive recording layer in an amount of from 0.02 to 5 $g/m^2$.

15. A multicolor heat-sensitive recording material according to claim 11, wherein said diazonium salt is present in microcapsules.

16. A multicolor heat-sensitive recording material having successively formed on a support a first heat-sensitive recording layer containing a diazonium salt having a maximum absorption wavelength shorter than 350 nm and a coupler undergoing color formation by thermally reacting with said diazonium salt, a second heat-sensitive recording layer containing a diazonium salt having a maximum absorption wavelength of 360 nm±20 nm and a coupler coloring a certain hue by thermally reacting with said diazonium salt, and a third heat-sensitive recording layer containing a diazonium salt having a maximum absorption wavelength of 400 nm±20 nm and and a coupler coloring a certain hue by thermally reacting with said diazonium salt, wherein said first heat-sensitive recording layer contains a compound represented by the following formula (1) as the diazonium salt having a maximum absorption wavelength shorter than 350 nm:

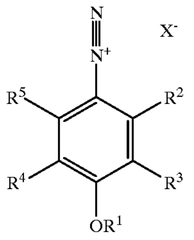

wherein $R^1$ represents an alkyl group or an aryl group; $R^2$, $R^3$, $R^4$ and $R^5$ each independently represents a hydrogen atom or an alkyl group, at least one of $R^2$, $R^3$, $R^4$, and $R^5$ represents an alkyl group, and $R^2$ and $R^3$, or $R^4$ and $R^5$, or $R^1$ and $R^3$, or $R^1$ and $R^4$, may combine with each other to form a ring; and $X^-$ represents an anion.

17. A multicolor heat-sensitive recording material according to claim 16, wherein said diazonium salt shown by the formula (1) is a compound represented by the following formula (2):

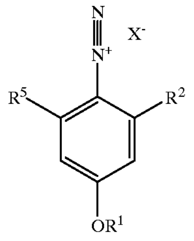

18. A multicolor heat-sensitive recording material according to claim 16, wherein said coupling component is a compound represented by the following formula (3):

$$E^1—CH_2—E^2$$

wherein $E^1$ and $E^2$ each independently represents an electron withdrawing group.

19. A multicolor heat-sensitive recording material according to claim 16, wherein said diazonium salt is present in microcapsules in an amount of from 0.02 to 5 g/$m^2$.

20. A multicolor heat-sensitive recording material according to claim 16, wherein said diazonium salt is present in microcapsules.

* * * * *

UNITED STATES PATENT AND TRADEMARK OFFICE

CERTIFICATE OF CORRECTION

PATENT NO. : 6,017,672 Page 1 of 1
APPLICATION NO. : 09/145345
DATED : January 25, 2000
INVENTOR(S) : Yoshimitsu Arai, Masatoshi Yumoto and Kimiatsu Nomura It is certified that error appears in the above-identified patent and that said Letters Patent is hereby corrected as shown below:

UNDER REFERENCES CITED U.S. PATENT DOCUMENTS PLEASE INSERT THE FOLLOWING:

4,895,826 1/1990 Watanabe et al. 503/202

UNDER REFERENCES CITED FOREIGN PATENT DOCUMENTS PLEASE INSERT THE FOLLOWING:

323887A 7/1989 Europe
2181564A 4/1987 Great Britain

Signed and Sealed this

Seventeenth Day of July, 2007

JON W. DUDAS
*Director of the United States Patent and Trademark Office*